US012803534B2

(12) United States Patent
Wang et al.

(10) Patent No.: US 12,803,534 B2
(45) Date of Patent: Nov. 17, 2026

(54) CIRCUITRY WITH NON-LINEARITY DISTORTION COMPENSATION

(71) Applicant: Apple Inc., Cupertino, CA (US)

(72) Inventors: Hongrui Wang, San Jose, CA (US); Abbas Komijani, Mountain View, CA (US); Li Gao, Guangzhou (CN); Nitesh Singhal, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 185 days.

(21) Appl. No.: 18/652,508

(22) Filed: May 1, 2024

(65) Prior Publication Data

US 2025/0343530 A1 Nov. 6, 2025

(51) Int. Cl.
*H03H 11/04* (2006.01)
*H03H 11/24* (2006.01)

(52) U.S. Cl.
CPC ............. *H03H 11/04* (2013.01); *H03H 11/24* (2013.01)

(58) Field of Classification Search
CPC ................................ H03H 11/04; H03H 11/24
USPC .......................................................... 327/308
See application file for complete search history.

(56) References Cited

U.S. PATENT DOCUMENTS

| | | | | |
|---|---|---|---|---|
| 8,737,526 | B2 | 5/2014 | Coan et al. | |
| 9,031,521 | B2 | 5/2015 | Yang et al. | |
| 9,197,168 | B2 | 11/2015 | Al-Qaq et al. | |
| 11,843,356 | B2 | 12/2023 | Lin | |
| 2006/0022740 | A1 * | 2/2006 | Kim ..................... | H03D 7/1458 327/359 |
| 2015/0340999 | A1 | 11/2015 | Kanaya | |
| 2017/0302230 | A1 | 10/2017 | Lehtola et al. | |
| 2019/0173439 | A1 | 6/2019 | Dunworth et al. | |
| 2022/0247358 | A1 | 8/2022 | Salameh | |
| 2022/0407471 | A1 * | 12/2022 | Akhtar .................. | H03F 1/3223 |

* cited by examiner

*Primary Examiner* — Tomi Skibinski
(74) *Attorney, Agent, or Firm* — Treyz Law Group; Jason Tsai

(57) ABSTRACT

An electronic device may include wireless circuitry. The wireless circuitry can include an amplifier with first and second input transistors and at least one non-linearity distortion compensation circuit that includes a third transistor having a gate terminal coupled to a gate terminal of the first input transistor, a fourth transistor having a gate terminal coupled to a gate terminal of the second input transistor, and a tail current source coupled to a source-drain terminal of the third transistor and to a source-drain terminal of the fourth transistor. The amplifier may be coupled to one or more additional non-linearity distortion compensation circuit. The non-linearity distortion compensation circuit may be coupled out-of-phase with the amplifier, whereas the additional non-linearity distortion compensation circuit may be coupled in-phase with the amplifier.

20 Claims, 11 Drawing Sheets

CIRCUITRY WITH NON-LINEARITY DISTORTION COMPENSATION

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless receiver circuitry in the wireless communications circuitry uses the antennas to transmit and receive radio-frequency signals.

Radio-frequency signals transmitted by an antenna can be fed through a power amplifier, which is configured to amplify low power analog signals to higher power signals more suitable for transmission through the air over long distances. Radio-frequency signals received at an antenna can be fed through a low noise amplifier, which is configured to amplify low power analog signals to higher power signals for ease of processing at a receiver. It can be challenging to design satisfactory radio-frequency amplifier circuitry for an electronic device.

SUMMARY

An aspect of the disclosure provides circuitry that includes first and second input transistors and an amplitude modulation to amplitude modulation (AMAM) or amplitude modulation to phase modulation (AMPM) distortion compensation circuit. The AMAM or AMPM distortion compensation circuit, sometimes referred to as a non-linearity distortion compensation/reduction circuit can include a third transistor having a gate terminal coupled to a gate terminal of the first input transistor, a fourth transistor having a gate terminal coupled to a gate terminal of the second input transistor, and a tail current source coupled to a first source-drain terminal of the third transistor and to a first source-drain terminal of the fourth transistor. The circuitry can further include an additional AMAM/AMPM distortion compensation circuit having a fifth transistor having a gate terminal coupled to the gate terminal of the first input transistor, a sixth transistor having a gate terminal coupled to the gate terminal of the second input transistor, and an additional tail current source coupled to a first source-drain terminal of the fifth transistor and to a first source-drain terminal of the sixth transistor.

An aspect of the disclosure provides circuitry that includes a differential amplifier having first and second input terminals and a distortion compensation circuit having input terminals coupled to the first and second input terminals of the differential amplifier. The distortion compensation circuit can further be coupled out-of-phase with the differential amplifier. The distortion compensation circuit can further include a tail current source configured to pass a tail current that is less than a half of an output current flowing through the differential amplifier. The circuitry can further include an additional distortion compensation circuit having input terminals coupled to the first and second input terminals of the differential amplifier, where the additional distortion compensation circuit is coupled in-phase with the differential amplifier. The circuitry can further include first tunable attenuation circuits coupled between the first and second input terminals of the differential amplifier and the distortion compensation circuit and second tunable attenuation circuits coupled between the first and second input terminals of the differential amplifier and the additional distortion compensation circuit.

An aspect of the disclosure provides circuitry that includes: a first input transistor having a gate terminal coupled to a first input terminal, a drain terminal coupled to a first output terminal, and a source terminal coupled to a ground line; a second input transistor having a gate terminal coupled to a second input terminal, a drain terminal coupled to a second output terminal, and a source terminal coupled to the ground line; a third transistor having a gate terminal coupled to the gate terminal of the first input transistor, a source terminal coupled to a first tail current source, and a drain terminal coupled to the second output terminal; a fourth transistor having a gate terminal coupled to the gate terminal of the second input transistor, a source terminal coupled to the first tail current source, and a drain terminal coupled to the first output terminal; a fifth transistor having a gate terminal coupled to the gate terminal of the first input transistor, a source terminal coupled to a second tail current source, and a drain terminal coupled to the first output terminal; and a sixth transistor having a gate terminal coupled to the gate terminal of the second input transistor, a source terminal coupled to the second tail current source, and a drain terminal coupled to the second output terminal.

Further features of the disclosure, its nature and various advantages will be more apparent from the accompanying drawings and following detailed description.

DETAILED DESCRIPTION

An electronic device may be provided with wireless circuitry. The wireless circuitry can include radio-frequency amplifiers and other transmitting or receiving circuits for processing signals in a transmit path or a receive path. An amplifier or other components in the transmit or receive path can include one or more input transistors that, in practice, exhibit non-linear current behavior. Such transistor non-linearities can, if care is not taken, result in amplitude modulation to amplitude modulation (AMAM) distortion and/or amplitude modulation to phase modulation (AMPM) distortion, which generates third order intermodulation distortion that degrade the error vector magnitude (EVM) and worsen the adjacent channel power ratio (ACPR), which measures an amount of signal interference in frequency channels adjacent to a channel of interest, of the wireless circuitry.

To compensate the AMAM/AMPM distortion, the amplifier can be coupled in parallel with one or more AMAM or AMPM compensation circuits. An AMAM/AMPM compensation circuit can be a differential circuit biased with a tail current source. The AMAM/AMPM compensation circuit can be biased in a current limited region to provide a highly compressive transconductance with higher order non-linearities. The polarity and magnitude of such higher order non-linearities produced by the AMAM/AMPM compensation circuit can be used to cancel out the third order intermodulation distortion of the amplifier without impacting the gain performance of the amplifier, which is technically advantageous for improving the overall performance of the wireless circuitry.

Figure 1:
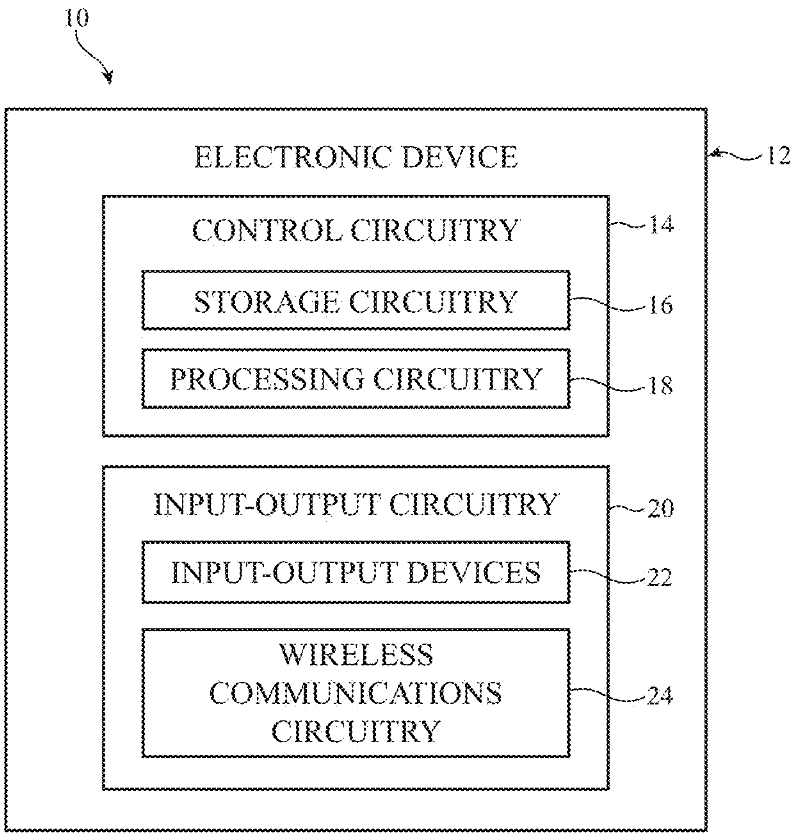
FIG. 1 is a diagram of an illustrative electronic device having wireless communications circuitry in accordance with some embodiments.

FIG. 1 is a diagram of an electronic device such as electronic device 10 that can be provided with one or more AMAM or AMPM compensation circuit(s). Electronic device 10 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols-sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G New Radio (NR) protocols, etc.), MIMO protocols, antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, electronic pencil (e.g., a stylus), and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless communications circuitry such as wireless communications circuitry 24 (sometimes referred to herein as wireless circuitry 24) for wirelessly conveying radio-frequency signals. While control circuitry 14 is shown separately from wireless communications circuitry 24 for the sake of clarity, wireless communications circuitry 24 may include processing circuitry that forms a part of processing circuitry 18 and/or storage circuitry that forms a part of storage circuitry 16 of control circuitry 14 (e.g., portions of control circuitry 14 may be implemented on wireless communications circuitry 24). As an example, control circuitry 14 (e.g., processing circuitry 18) may include baseband processor circuitry or other control components that form a part of wireless communications circuitry 24.

Wireless communications circuitry 24 may include radio-frequency (RF) transceiver circuitry formed from one or more integrated circuits, power amplifier circuitry configured to amplify uplink radio-frequency signals (e.g., radio-frequency signals transmitted by device 10 to an external device), low-noise amplifiers configured to amplify downlink radio-frequency signals (e.g., radio-frequency signals received by device 10 from an external device), passive radio-frequency components, one or more antennas, transmission lines, and other circuitry for handling radio-frequency wireless signals. Wireless signals can also be sent using light (e.g., using infrared communications).

Wireless circuitry 24 may include radio-frequency transceiver circuitry for handling transmission and/or reception of radio-frequency signals in various radio-frequency communications bands. For example, the radio-frequency transceiver circuitry may handle wireless local area network (WLAN) communications bands such as the 2.4 GHz and 5 GHz Wi-Fi® (IEEE 802.11) bands, wireless personal area network (WPAN) communications bands such as the 2.4 GHz Bluetooth® communications band, cellular telephone communications bands such as a cellular low band (LB) (e.g., 600 to 960 MHz), a cellular low-midband (LMB) (e.g., 1400 to 1550 MHz), a cellular midband (MB) (e.g., from 1700 to 2200 MHz), a cellular high band (HB) (e.g., from 2300 to 2700 MHZ), a cellular ultra-high band (UHB) (e.g., from 3300 to 5000 MHz), or other cellular communications bands between about 600 MHz and about 5000 MHz (e.g., 3G bands, 4G LTE bands, 5G New Radio Frequency Range 1 (FR1) bands below 10 GHz, 5G New Radio Frequency Range 2 (FR2) bands at millimeter and centimeter wavelengths between 20 and 60 GHz, etc.), a near-field communications (NFC) band (e.g., at 13.56 MHz), satellite navigations bands (e.g., an L1 global positioning system (GPS) band at 1575 MHz, an L5 GPS band at 1176 MHz, a Global Navigation Satellite System (GLONASS) band, a BeiDou Navigation Satellite System (BDS) band, etc.), an ultra-wideband (UWB) communications band supported by the IEEE 802.15.4 protocol and/or other UWB communications protocols (e.g., a first UWB communications band at 6.5 GHz and/or a second UWB communications band at 8.0 GHz), and/or any other desired communications bands. The communications bands handled by such radio-frequency transceiver circuitry may sometimes be referred to herein as frequency bands or simply as "bands," and may span corresponding ranges of frequencies. In general, the radio-frequency transceiver circuitry within wireless circuitry 24 may cover (handle) any desired frequency bands of interest.

Figure 2:
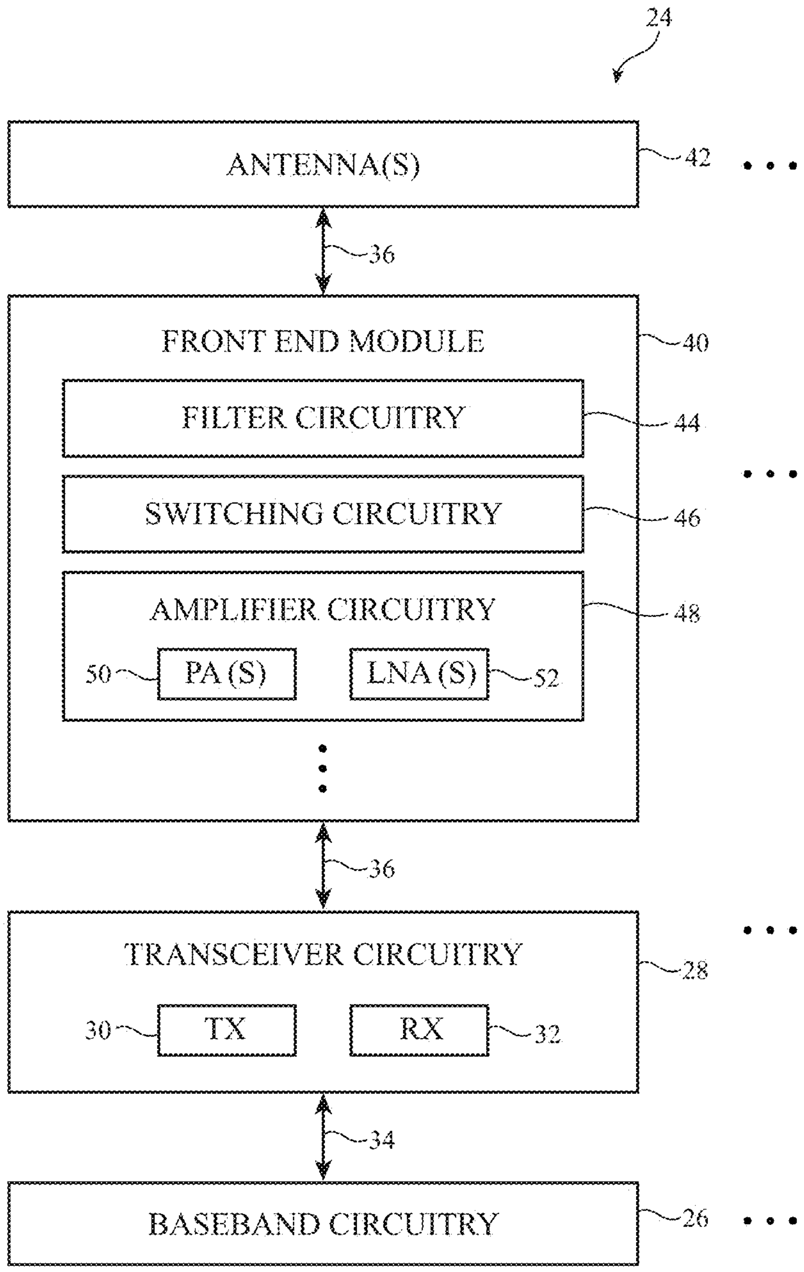
FIG. 2 is a diagram of illustrative wireless communications circuitry having amplifier circuitry in accordance with some embodiments.

FIG. 2 is a diagram showing illustrative components within wireless circuitry 24. As shown in FIG. 2, wireless circuitry 24 may include baseband circuitry 26 such as one or more baseband processors, radio-frequency (RF) transceiver circuitry such as radio-frequency transceiver 28, radio-frequency front end circuitry such as radio-frequency front end module (FEM) 40, and antenna(s) 42. Baseband circuitry 26 may be coupled to transceiver 28 over baseband path 34. Transceiver 28 may be coupled to antenna 42 via radio-frequency transmission line path 36. Radio-frequency front end module 40 may be disposed on radio-frequency transmission line path 36 between transceiver 28 and antenna 42. Any block shown in FIG. 2 can be provided with one or more AMAM and/or AMPM (distortion) compensation circuits configured to improve the EVM of the overall wireless circuitry 24.

In the example of FIG. 2, wireless circuitry 24 is illustrated as including only a single baseband processor 26, a single transceiver 28, a single front end module 40, and a single antenna 42 for the sake of clarity. In general, wireless circuitry 24 may include any desired number of baseband processors 26, any desired number of transceivers 28, any desired number of front end modules 40, and any desired number of antennas 42. Each baseband processor 26 may be coupled to one or more transceiver 28 over respective baseband paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, baseband circuitry 26 may provide baseband signals to transceiver 28 over baseband path 34. Transceiver 28 may further include circuitry for converting the baseband signals received from baseband circuitry 26 into corresponding radio-frequency signals. For example, transceiver circuitry 28 may include mixer circuitry for up-converting (or modulating) the baseband signals to radio-frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry for down-converting (or demodulating) the received radio-frequency signals to baseband frequencies prior to conveying the received signals to baseband circuitry 26 over baseband path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, baseband circuitry 26 and/or portions of transceiver 28 (e.g., a host processor on transceiver 28) may form a part of control circuitry 14. Control circuitry 14 (e.g., portions of control circuitry 14 formed on baseband circuitry 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHZ, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

Figure 3:
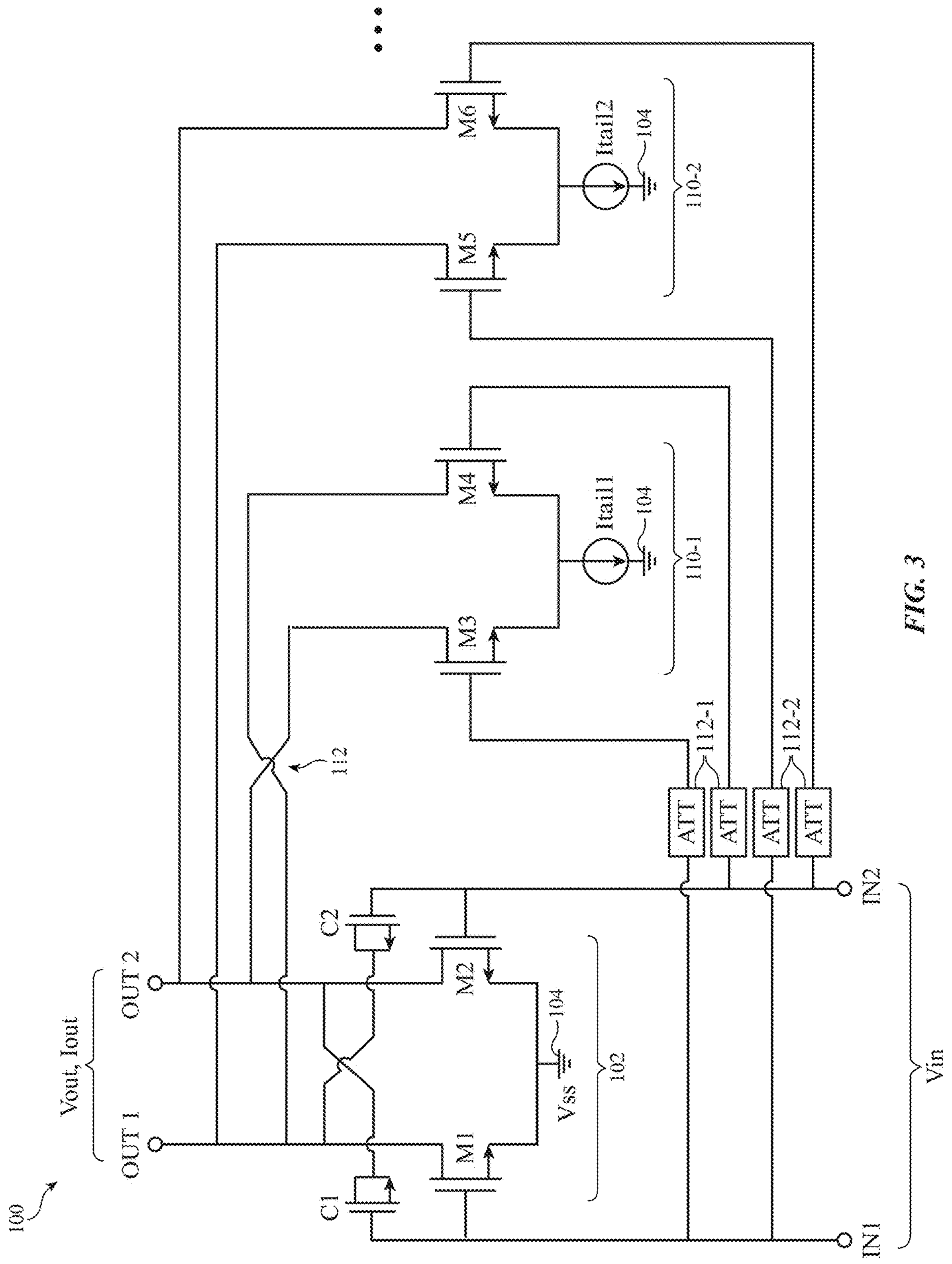
FIG. 3 is a circuit diagram of illustrative amplifier circuitry having amplitude modulation to amplitude modulation (AMAM) distortion compensation circuits in accordance with some embodiments.

FIG. 3 is a diagram of an differential circuitry such as differential circuitry 100 that can be part of wireless circuitry 24. Differential circuitry 100 of FIG. 3 can generally represent a power amplifier 50 in the transmit path, a variable gain amplifier (VGA) in the transmit path, a low noise amplifier 52 in the receive path, a mixer or modulator in the transmit path, a mixer or demodulator in the receive path, some other gain block in the transmit or receive path, some other component in the front end module 40 or transceiver 28, or other component along transmission line path 36. Scenarios in which differential circuitry 100 represents a radio-frequency amplifier is sometimes described herein as an example. Differential circuitry 100 can thus sometimes be referred to as amplifier circuitry.

As shown in FIG. 3, amplifier circuitry 100 can include a main differential circuit such as amplifier 102, sometimes referred to as a main or primary amplifier. Main amplifier 102 may include at least transistors M1 and M2. Transistors M1 and M2 may be n-type (n-channel) transistors such as n-type metal-oxide-semiconductor (NMOS) devices. Transistor M1 may have a source terminal coupled to a ground power supply line 104 (e.g., a ground line on which ground power supply voltage Vss is provided), a drain terminal, and a gate terminal coupled to a first input terminal IN1. Transistor M2 may have a source terminal coupled to ground power supply line 104, a drain terminal, and a gate terminal coupled to a second input terminal IN2. Input terminals IN1 and IN2 serve collectively as the differential input port of amplifier 102. Transistors M1 and M2 are thus sometimes referred to as the "input transistors." The terms "source" and "drain" terminals used to refer to current-conveying terminals in a transistor may be used interchangeably and are sometimes referred to as "source-drain" terminals. Thus, the source terminal of transistor M1 can sometimes be referred to as a first source-drain terminal, and the drain terminal of transistor M1 can be referred to as a second source-drain terminal (or vice versa).

Amplifier 102 can optionally include capacitors C1 and C2. Capacitor C1 may be first metal-oxide-semiconductor capacitor (MOSCAP) having a gate terminal coupled to first input terminal IN1 and having a body terminal that is cross-coupled to the drain terminal of the second input transistor M2. Capacitor C2 may be a second MOSCAP having a gate terminal coupled to second input terminal IN2 and having a body terminal that is cross-coupled to the drain terminal of the first input transistor M1. Configured in this way, cross-coupled MOS capacitors C1 and C2 can be used to neutralize the gate-to-drain parasitic capacitance of input transistors M1 and M2 and are therefore sometimes referred to as parasitic capacitance neutralization components. In other embodiments, the parasitic capacitance neutralization components can be implemented as cross-coupled transistors, metal-insulator-metal (MIM) capacitors, deep trench capacitors, polysilicon capacitors, or other electronic devices exhibiting capacitance. The use of parasitic capacitance neutralization capacitors C1 and C2 is optional and can be omitted to save cost.

The drain terminal of input transistor M1 may be coupled to a first amplifier output terminal OUT1, whereas the drain terminal of input transistor M2 may be coupled to a second amplifier output terminal OUT2. Output terminals OUT1 and OUT2 may serve collectively as the differential output port of amplifier 102. A differential output voltage Vout can be provided across the output terminals OUT1 and OUT2. An output current Iout can flow through the output port of amplifier 102.

If desired, amplifier 102 can optionally be provided with cascode transistors coupled between the input transistors and the amplifier output terminals. For example, a first cascode transistor can be coupled in series between input transistor M1 and output terminal OUT1, whereas a second cascode transistor can be coupled in series between input transistor M2 and output terminal OUT2. Such cascode transistors, sometimes referred to as a cascode amplifier stage, can be included to increase the output impedance of amplifier 102 and can optionally be used to provide different gain steps (e.g., by selectively adjusting the drive strength of the cascode transistors). In general, one or more transistors, capacitors, resistors, inductors, transformers, and/or other load components can be coupled to the amplifier output terminals OUT1 and OUT2.

The performance of a radio-frequency (RF) amplifier is sometimes quantified by a parameter known as error vector magnitude (EVM). Ideally, a signal transmitted by a radio-frequency amplifier would have signal modulation constellation points at certain ideal locations on a complex plane. Due to design imperfections, distortion, spurious signals, and/or noise, however, the actual constellation points often deviate from the ideal locations. Error vector magnitude is a measure of how far the actual points deviate from the ideal locations.

Amplifiers, in general, have a linear operating range and a non-linear operating range. To avoid signal distortion, amplifiers are often operated in the linear range. When operated in the non-linear range, the ratio of input power to output power may not be constant. Thus, as the input signal amplitude increases, a disproportionate increase in the output signal amplitude may occur. This unwanted additional amplitude modulation due to the non-linear characteristics of the amplifier is sometimes referred to as amplitude modulation to amplitude modulation (AMAM) distortion. Similar to the output signal amplitude, the output phase of an amplifier may change disproportionately as the input signal amplitude increases. This unwanted additional amount of phase modulation due to the non-linear characteristics of the amplifier is sometimes referred to as amplitude modulation to phase modulation (AMPM) distortion. In general, amplitude to amplitude modulation (AMAM) distortion can arise due to undesired gain change from non-linear transistor transconductance (sometimes referred to as "Gm") and output resistance (sometimes referred to as "Rout") of an amplifier. The AMAM distortion can be more prominent in amplitude based modulation schemes such as Quadrature Amplitude Modulation (QAM) schemes.

Figure 4:
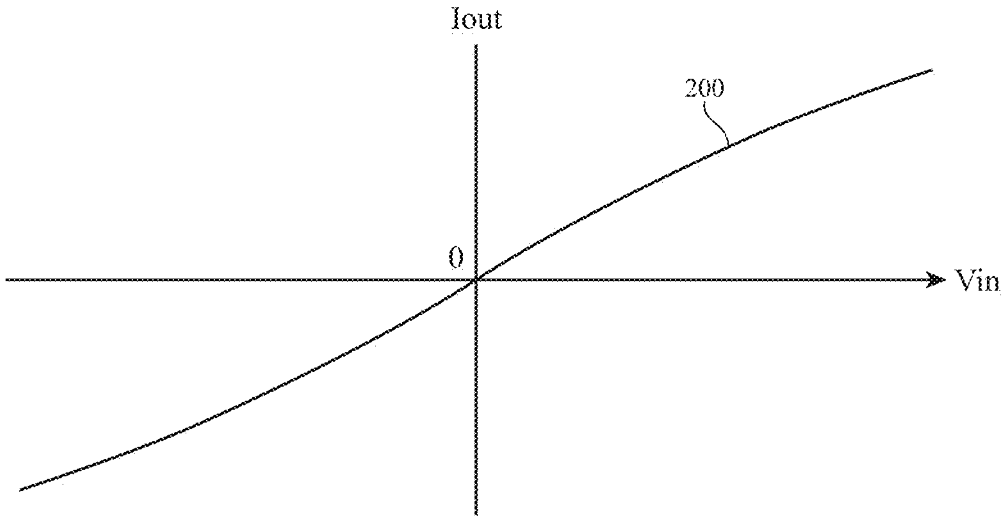
FIG. 4 is a diagram plotting amplifier output current as a function of input voltage.

FIG. 4 is a diagram plotting amplifier output current Iout as a function of input voltage Vin. As shown in FIG. 4, the Iout curve 200 generally increases with the magnitude of input voltage Vin. On one end, the output current Iout becomes more positive at greater +Vin levels. In the other end, the output current Iout becomes more negative at larger −Vin levels. An amplifier's transconductance Gm can refer to a parameter that measures how much the output current of a device changes in response to a change in the input voltage. In other words, amplifier transconductance Gm may represent the first derivative of curve 200 in FIG. 4.

Figure 5:
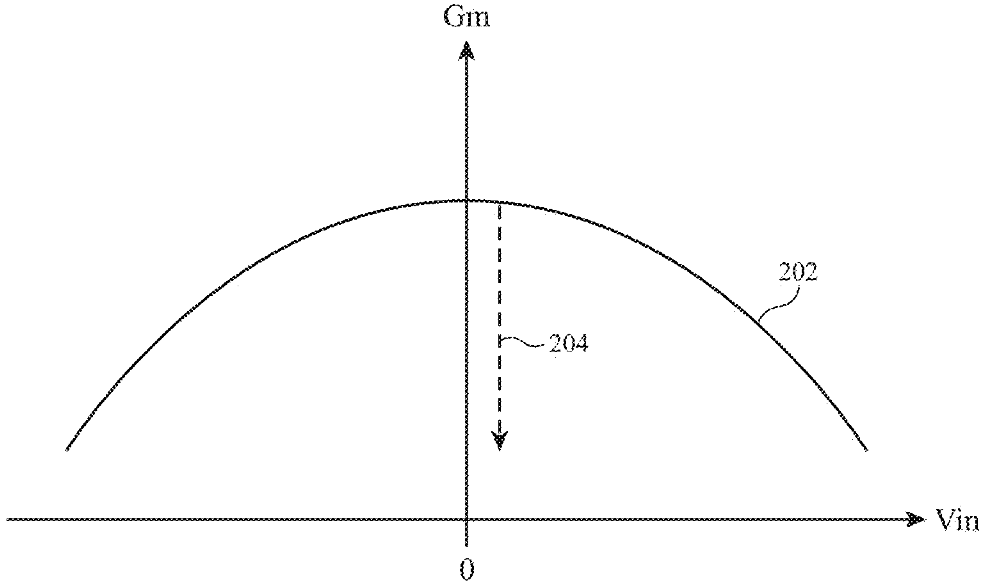
FIG. 5 is a diagram plotting amplifier transconductance as a function of input voltage.

FIG. 5 is a diagram plotting amplifier transconductance Gm as a function of input voltage Vin. As shown in FIG. 5, transconductance curve 202 may exhibit a maximum level when input voltage Vin is equal to zero and may decrease to lower levels when input voltage Vin becomes more positive or more negative. Such drop in amplifier transconductance Gm at larger input voltages, as illustrated by arrow 204 in FIG. 5, can lead to a reduction in amplifier gain at increasing input signal amplitude levels, a suboptimal phenomenon sometimes referred to as gain compression. Such gain compression can generate $3^{rd}$ order intermodulation (IM3) products that either fall into a target signal band of interest, resulting in EVM degradation, or enter adjacent channel bands, creating sideband spectra resulting in heightened interference.

To help compensate or mitigate unwanted AMAM distortion, amplifier 100 may be provided with AMAM distortion compensation circuits such as AMAM distortion compensation circuits 110-1 and 110-2 in FIG. 3. Although at least two AMAM distortion compensation circuits 110 are shown in the example of FIG. 3, amplifier 100 can in general include only one compensation circuit 110 or more than two compensation circuits 110 (e.g., three or more compensation circuits 110, four or more compensation circuits 110, five to ten compensation circuits 110, or more than ten compensation circuits 110). Multiple AMAM distortion compensation circuits are sometimes referred to collectively as AMAM distortion compensation or correction circuitry.

Each compensation circuit 110 can be a differential circuit biased with a tail current source and coupled in parallel with the main amplifier 102. First compensation circuit 110-1 may include transistors M3 and M4 coupled to a first shared tail current source Itail1. Transistor M3 may have a gate terminal coupled to the gate terminal of input transistor M1 via a first attenuation circuit 112-1, a source terminal coupled to tail current source Itail1, and a drain terminal coupled to output terminal OUT2. Transistor M4 may have a gate terminal coupled to the gate terminal of input transistor M2 via a second attenuation circuit 112-1, a source terminal coupled to tail current source Itail1, and a drain terminal coupled to output terminal OUT1. The first tail current source Itail1 may be coupled between a first tail node shorted to the source terminals of transistors M3 and M4 and ground line 104. Additionally, transistors M3 and M4 may exhibit parasitic gate-to-drain capacitance on the output terminals OUT1 and OUT2 of main amplifier 102. Such gate-to-drain capacitance of transistors M3 and M4 can optionally be configured to serve as capacitance neutralization capacitors for amplifier 102, assuming they are cross-coupled to transistors M1 and M2 as shown by cross connection 112, and can help obviate the need for separate neutralization capacitors C1 and C2. This can help reduce circuit area and cost.

Similarly, second compensation circuit 110-2 may include transistors M5 and M6 coupled to a second shared tail current source Itail2. Transistor M5 may have a gate terminal coupled to the gate terminal of input transistor M1 via a first attenuation circuit 112-2, a source terminal coupled to tail current source Itail2, and a drain terminal coupled to output terminal OUT1. Transistor M6 may have a gate terminal coupled to the gate terminal of input transistor M2 via a second attenuation circuit 112-2, a source terminal coupled to tail current source Itail2, and a drain terminal coupled to output terminal OUT2. The second tail current source Itail2 may be coupled between a second tail node shorted to the source terminals of transistors M5 and M6 and ground power supply line 104. Differential compensation circuits 110-1 and 110-2 coupled to the main amplifier 102 in this way are sometimes referred to as "auxiliary" differential pair amplifiers or auxiliary differential circuits.

The amount of current passing through the tail current sources of compensation circuits 110 should be fixed and substantially less than the amount of output current Iout flowing through the main amplifier 102. For example, the tail current flowing through current sources Itail1 and/or Itail2 should be less than a half, less than a quarter, less than 1/5, less than 1/10, less than 1/20, less than 1/30, less than 1/40, less than 1/50, less than 1/100, or other suitable fraction of output current Iout flowing through the main amplifier 102. Limiting the tail current of the auxiliary compensation circuits 110 in this way can help ensure that any current flowing into the auxiliary compensation circuits 110 from the main amplifier output path is small and thus won't impact the fundamental transconductance Gm of the main amplifier 102.

Figure 6:
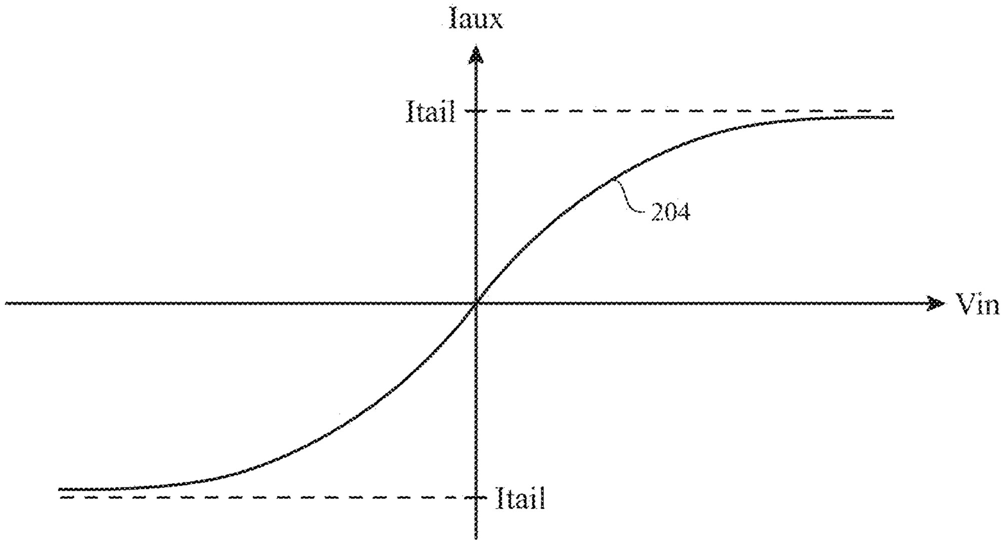
FIG. 6 is a diagram plotting current provided by an AMAM distortion compensation circuit in accordance with some embodiments.
Figure 7:
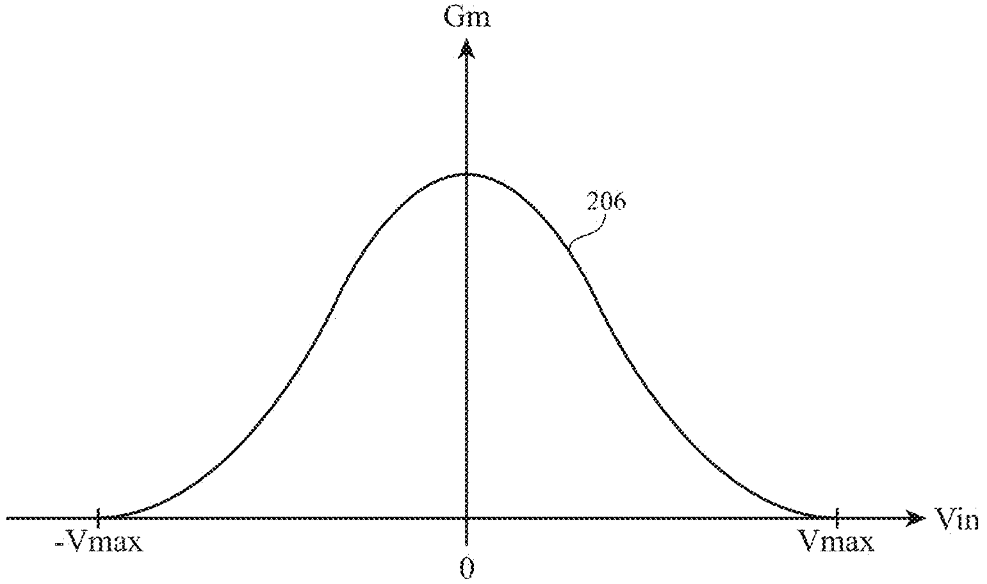
FIG. 7 is a diagram plotting transconductance of an AMAM distortion compensation circuit in accordance with some embodiments.

In particular, compensation circuits 110 may be biased in a current-limited or saturation region so that compensation circuits 110 can produce highly compressive transconductances with higher order non-linearities. FIG. 6 is a diagram plotting current Iaux that can flow through an AMAM distortion compensation circuit 110. As shown in FIG. 6, the current profile 204 can saturate at the positive tail current level Itail for large +Vin levels and can saturate at the negative tail current level-Itail for large −Vin levels. FIG. 7 plots the corresponding transconductance Gm of compensation circuit 110, representing the first derivative of curve 204 in FIG. 6 as a function of input voltage Vin. As shown in FIG. 7, transconductance curve 206 may exhibit a maximum level when input voltage Vin is equal to zero and may decrease to lower levels when input voltage Vin becomes more positive or more negative. In particular, the transconductance Gm compresses down to zero when input voltage Vin reaches a positive maximum voltage level Vmax. On the other end, transconductance also compresses down to zero when input voltage Vin reaches a negative maximum voltage level −Vmax. These maximum voltage levels +Vmax and −Vmax correspond to input voltage levels when current Iaux saturates at +Itail and −Itail levels, respectively, shown in FIG. 6.

Such Gm compression exhibited by one or more compensation circuit(s) 110 can produce their own $3^{rd}$ order or other high order non-linearity products or terms. Such higher order non-linearities produced from compensation circuits 110 can be adjusted and applied to amplifier 102 to cancel out the $3^{rd}$ order non-linearity of the main amplifier 102 without negatively impacting signal gain. For example, the Gm profile 206 of FIG. 7 associated with compensation circuit 110 can be inverted and applied "out-of-phase" to the main amplifier 102 to help at least partially cancel out the $3^{rd}$ order non-linearity terms of amplifier 102. This out-of-phase application of Gm can be achieved via a cross-coupling or out-of-phase connection 112 that couples compensation circuit 110-1 to amplifier 102.

In the example of FIG. 3, compensation circuit 110-2 may be coupled in parallel with amplifier 102 via an "in-phase" connection, where the gate and drain terminals of M5 are respectively coupled to the gate and drain terminals of input transistor M1 and where the gate and drain terminals of M6 are respectively coupled to the gain and drain terminals of input transistor M2. In contrast to an out-of-phase connection, such in-phase connection allows the transconductance Gm of compensation circuit 110-2 to be additively applied to the fundamental Gm of amplifier 102. An "out-of-phase" connection can therefore refer to and be defined herein as a connection that enables the current passing through a distortion compensation circuit 110 to be subtracted from the output current of main amplifier 102. Conversely, an "in-phase" connection can refer to and be defined herein as a connection that enables the current passing through a distortion compensation circuit 110 to be added to the output current of main amplifier 102.

The example of FIG. 3 in which compensation circuit 110-1 is coupled out-of-phase to amplifier 102 and in which compensation circuit 110-2 is coupled in-phase to amplifier 102 is illustrative. In general, amplifier circuitry 100 can include one or more compensation circuits, at least portions of which are coupled in-phase and out-of-phase with amplifier 102, all of which are coupled out-of-phase with amplifier 102, or all of which are coupled in-phase with amplifier 102. Cancelling out higher order non-linearity terms in this way can be technically advantageous and beneficial to reduce AMAM distortion.

Such cancellation of undesired non-linearity terms can be illustrated in the frequency domain. Consider a two-tone scenario in which the input/gate terminals of the transistors in circuitry 100 receive a first signal at a first frequency (tone) f1 and receive a second signal at a second frequency (tone) f2. In the example of FIG. 3, the input transistors M1 and M2 can have gate terminals configured to receive an input signal $[v_{in0}(f1)+v_{in0}(f2)]$. Due to third-order non-linearity of the input transistors M1 and M2, direct IM3 currents such as $i_{out0}(2*f1-f2)$ and $i_{out0}(2*f2-f1)$ can be generated at the output terminals of the main amplifier 102.

Transistors M3 and M4 of auxiliary circuit 110-1 can have gate terminals configured to receive an input signal $[v_{in1}(f1)+v_{in1}(f2)]$. An IM2 signal such as $v_1(f1-f2)$ can be generated at the source terminals of transistors M3 and M4 (e.g., at the tail node of circuit 110-1). The mixing of the signals at the gate and source terminals of transistors M3 and M4 can produce corresponding IM3 currents $i_{out1}(2*f1-f2)$ and $i_{out1}(2*f2-f1)$ at the drain terminals of M3 and M4.

Similarly, transistors M5 and M6 of auxiliary circuit 110-2 can have gate terminals configured to receive an input signal $[v_{in2}(f1)+v_{in2}(f2)]$. An IM2 signal such as $v_2(f1-f2)$ can be generated at the source terminals of transistors M5 and M6 (e.g., at the tail node of circuit 110-2). The mixing of the signals at the gate and source terminals of transistors M5 and M6 can produce corresponding IM3 currents $i_{out2}(2*f1-f2)$ and $i_{out2}(2*f2-f1)$ at the drain terminals of M5 and M5. The IM3 currents generated by the auxiliary compensation circuits (e.g., $i_{out1}(2*f1-f2)$, $i_{out1}(2*f2-f1)$, $i_{out2}(2*f1-f2)$, and $i_{out2}(2*f2-f1)$) can be applied in-phase and/or out-of-phase to the output terminals of the main amplifier 102 to cancel out the IM3 currents $i_{out0}(2*f1-f2)$ and $i_{out0}(2*f2-f1)$ associated with the input transistors M1 and M2. Operating circuitry 100 in this way can thus improve gain performance while reducing non-linearity.

Figure 8:
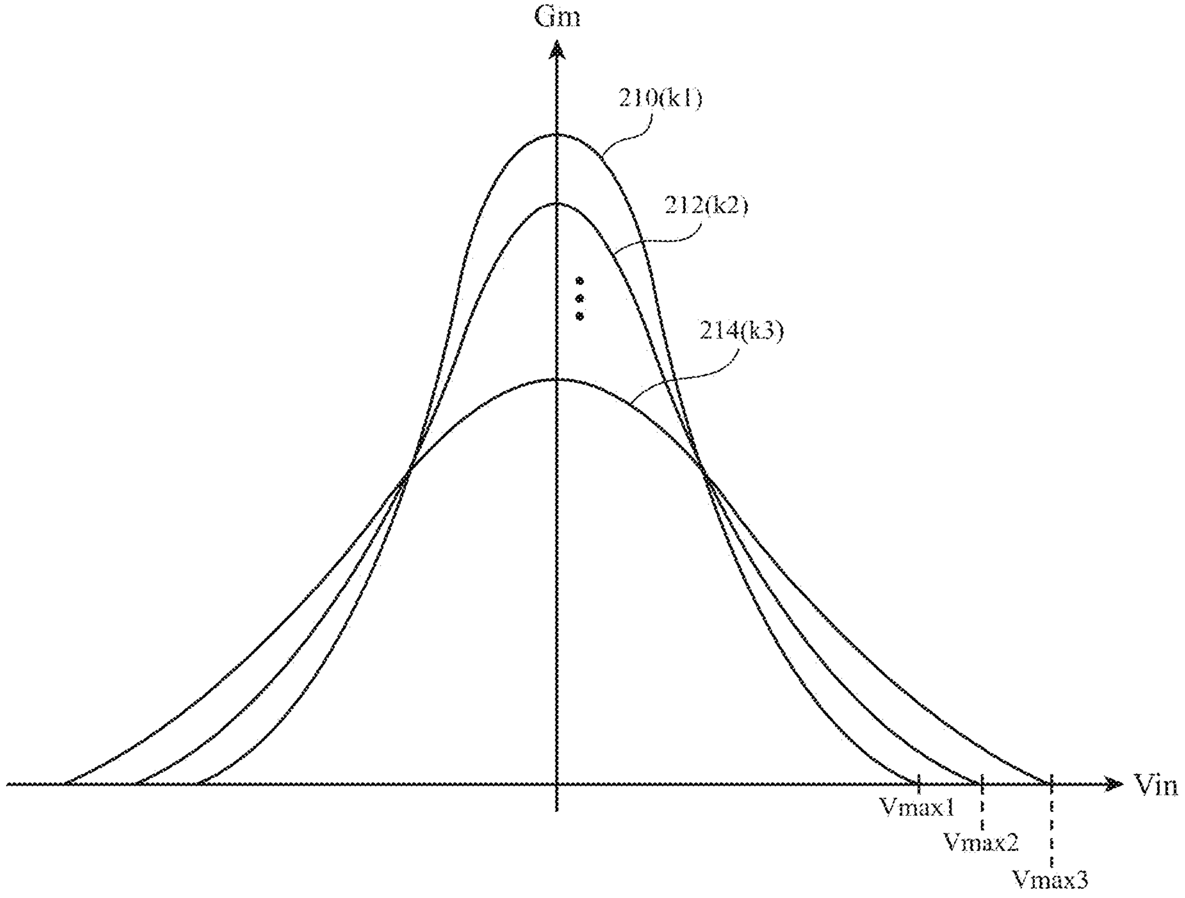
FIG. 8 is plot showing how the transconductance of an AMAM distortion compensation circuit can be adjusted via different attenuation factors in accordance with some embodiments.

The example of FIG. 7 illustrates a Gm profile 206 that varies between +Vmax and −Vmax defining a total gain compression voltage range equal to 2*Vmax. In accordance with some embodiments the gain compression voltage range provided by an AMAM distortion compensation circuit 110 can be adjustable. FIG. 8 is a plot showing how the transconductance Gm of compensation circuit 110 can be adjusted using different attenuation factors. The different attenuation factors can be provided by tuning or adjusting signal attenuation circuits 112-1 and 112-2. For example, attenuation circuits 112-1 can be adjusted to provide a first attenuation factor for tuning the gain compression voltage range for compensation circuit 110-1, whereas attenuation circuits 112-2 can be adjusted to provide a second attenuation factor for tuning the gain compression voltage range for compensation circuit 110-2.

As shown in FIG. 8, a first curve 210 may correspond to a first Gm profile produced when the attenuation factor is adjusted to a first value k1, a second curve 212 may correspond to a second Gm profile produced when the attenuation factor is adjusted to a second value k2 different than k1, a third curve 214 may correspond to a third Gm profile produced when the attenuation factor is adjusted to a third value k3 different than k1 and k2, and so on. Attenuation factor k2 may provide more signal attenuation than k1. Attenuation factor k3 may provide more signal attenuation than k2. In general, the attenuation circuits 112 can be configured to provide signal attenuation of about −1 dB, −2 dB, −3 dB, −4 dB, −5 dB, −5 to −10 dB, or other suitable amounts of signal reduction.

In the example of FIG. 8, a greater signal attenuation will lower the maximum Gm at Vin of zero while extending the maximum gain compression voltage range. For instance, comparing curves 210 and 212, the Gm curve 212 associated with more signal attenuation has a lower maximum Gm but extends the positive voltage range from Vmax1 to Vmax2 that is greater than Vmax1. Similarly, comparing curves 212 and 214, the Gm curve 214 associated with more signal attenuation has an even lower maximum Gm but further extends the positive voltage range from Vmax2 to Vmax3 that is greater than Vmax2. Thus, the amount of gain compression provided by each AMAM distortion compensation circuit 110 can be adjusted by tuning the attenuation factor of circuits 112 that couple the inputs of circuits 110 to the gate terminals of input transistors M1 and M2 in the main amplifier 102.

Figure 9A:
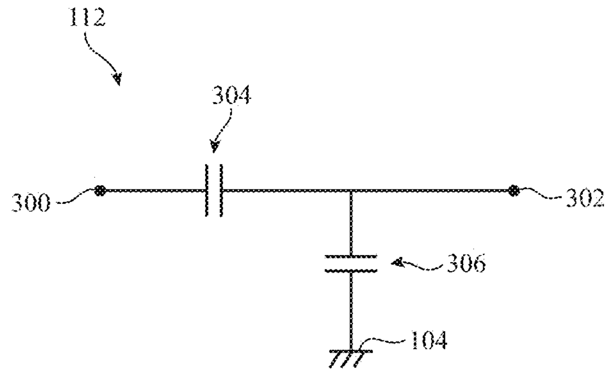
FIGS. 9A, 9B, and 9C show various implementations of a signal attenuation circuit in accordance with some embodiments.
Figure 9B:
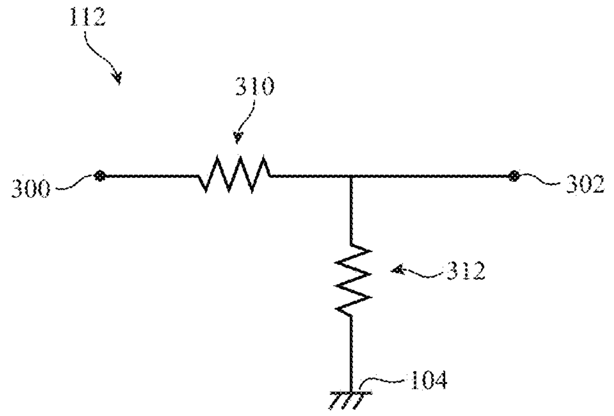
Figure 9C:
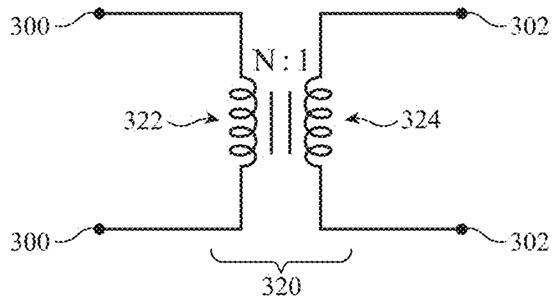

The signal attenuation circuits 112 can be implemented in various ways (see, e.g., FIGS. 9A, 9B, and 9C). FIG. 9A shows one suitable implementation of a signal attenuation circuit 112. As shown in FIG. 9A, attenuation circuit 112 can include a series capacitor 304 coupled to a shunt capacitor 306. Series capacitor 304 may have a first terminal coupled to an input terminal 300 and a second terminal coupled to an output terminal 302. Shunt capacitor 306 may have a first terminal coupled to output terminal 302 and a second terminal coupled to ground line 104. Input terminal 300 may be coupled to a gate of one of the input transistors M1 or M2 in main amplifier 102. Output terminal 302 may be coupled to a gate of one of the transistors in a corresponding AMAM distortion compensation circuit 110. An attenuation circuit 112 configured in this way is sometimes referred to as a capacitive divider circuit.

FIG. 9B shows another implementation of signal attenuation circuit 112. As shown in FIG. 9B, attenuation circuit 112 can include a series resistor 310 coupled to a shunt resistor 312. Series resistor 310 may have a first terminal coupled to an input terminal 300 and a second terminal coupled to an output terminal 302. Shunt resistor 312 may have a first terminal coupled to output terminal 302 and a second terminal coupled to ground line 104. Input terminal 300 may be coupled to a gate of one of the input transistors M1 or M2 in main amplifier 102. Output terminal 302 may be coupled to a gate of one of the transistors in a corresponding AMAM distortion compensation circuit 110. An attenuation circuit 112 configured in this way is sometimes referred to as a resistive divider circuit.

FIG. 9C shows another implementation of signal attenuation circuit 112. As shown in FIG. 9C, attenuation circuit 112 can include a primary coil 322 inductively coupled to a secondary coil 324. Primary coil 322 may have opposing terminals coupled to differential input terminals 300. Secondary coil 324 may have opposing terminals coupled to differential output terminals 302. Primary coil 322 may have a first number of turns, whereas secondary coil 324 may have a second number of turns different than the first number of turns. A ratio of the first number of turns in primary coil 322 to the second number of turns in coil 324 may be set to N:1 or other suitable ratio to provide a target attenuation factor. The differential input terminals 300 may be coupled to the gates of input transistors M1 and M2 in main amplifier 102. The differential output terminal 302 may be coupled to the gates of the differential pair transistors in a corresponding AMAM distortion compensation circuit 110. Coils 322 and 324 arranged in this way collectively form a transformer and is thus sometimes referred to as a transformer based attenuation circuit. The embodiments of FIGS. 9A, 9B, and 9C are exemplary. In general, other types of signal attenuation circuits 112 can be employed within circuitry 100 for tuning the Gm profiles of the one or more AMAM distortion compensation circuits 110.

Figure 10:
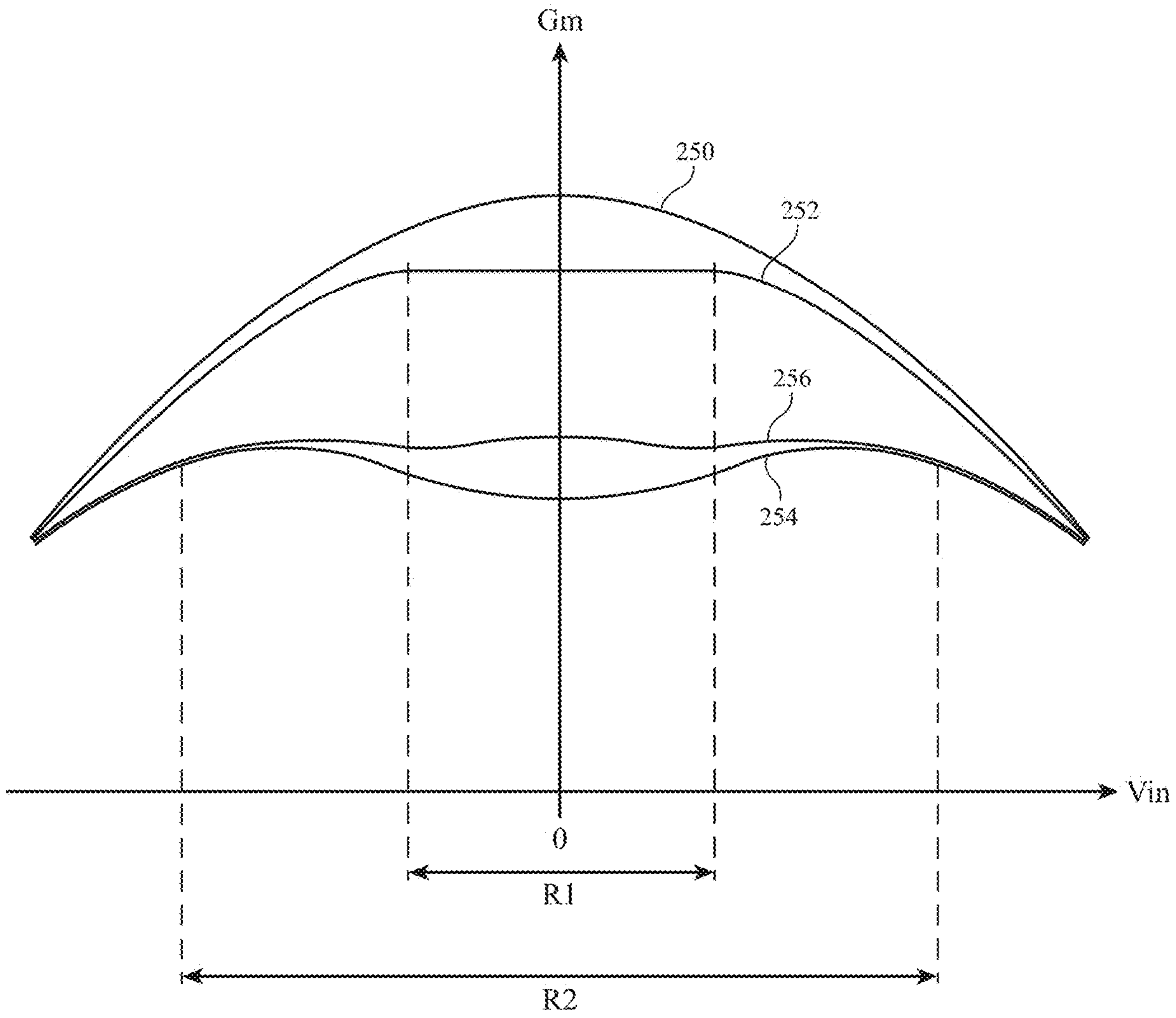
FIG. 10 is a plot showing how a $3^{rd}$ order non-linearity cancellation range can be adjusted by selectively activating one or more AMAM distortion compensation circuit(s) in accordance with some embodiments.

FIG. 10 is a plot showing how a $3^{rd}$ order non-linearity cancellation range can be adjusted by selectively activating one or more AMAM distortion compensation circuit(s) 110 within amplifier circuitry 100. Curve 250 may represent a Gm profile for circuitry 100 when no compensation circuit 110 has been activated or switched into use. As shown by curve 250, the overall transconductance of amplifier circuitry 100 will vary throughout the input voltage range. In contrast, curve 252 may represent an improved Gm profile for circuitry 100 when at least one compensation circuit such as compensation circuit 110-1 in FIG. 3 is activated or switched into use. As shown by curve 252, the overall transconductance of amplifier circuitry 100 may be flattened when input voltage Vin is within a first voltage range R1. This Gm flattening may be a result of $3^{rd}$ order intermodulation distortion cancellation.

Furthermore, curve 254 may represent another Gm profile for amplifier circuitry 100 when compensation circuit 110-1 is tuned using a different signal attenuation factor. As described in connection with FIG. 8, the gain compression voltage range can be extended by adjusting or enlarging the attenuation factor k. Curve 254 can thus correspond to a scenario in which compensation circuit 110-1 has been adjusted to provide more signal attenuation than that of curve 252. The Gm cancellation contribution from compensation circuit 110-1 can be adjusted using attenuation circuit 112-1 (e.g., by tuning the attenuation factor of circuit 112-1). As shown by curve 254, the overall transconductance of amplifier circuitry 100 may be relatively flat when input voltage Vin is within a second voltage range R2 that is wider than the first voltage range R1 associated with curve 252.

Moreover, curve 256 may represent yet another Gm profile for amplifier circuitry 100 when compensation circuit 110-1 and compensation circuit 110-2 are simultaneously activated or switched into use. Compared to curve 254, curve 256 may exhibit an even flatter response within the extended voltage range R2. The use of more than one compensation circuits 110 can thus help further optimize the Gm profile (e.g., by selectively applying cancelling IM3 terms via an out-of-phase connection and/or applying additive IM3 terms via an in-phase connection). The Gm cancellation or additive contribution from compensation circuit 110-2 can be adjusted using attenuation circuit 112-2 (e.g., by tuning the attenuation factor of circuit 112-2). In other words, a second or additional auxiliary compensation circuit (e.g., circuit 110-2) can be added to help correct any residual error from the first auxiliary compensation circuit (e.g., circuit 110-1) to help provide a flatter Gm profile.

Figure 11:
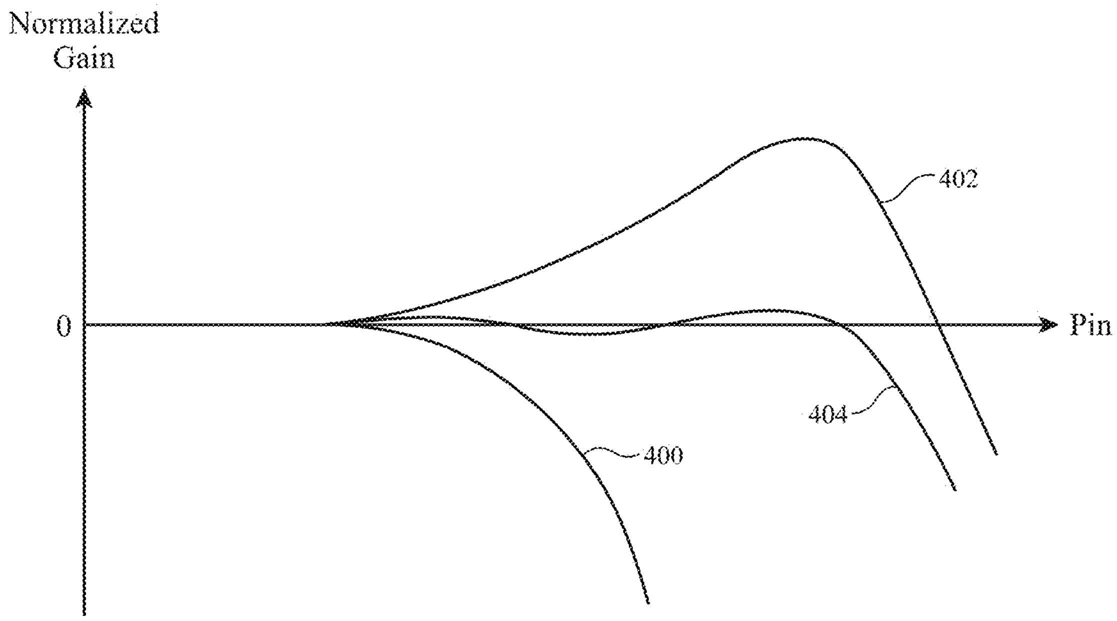
FIG. 11 is a plot showing how amplifier gain can be improved by selectively activating one or more AMAM distortion compensation circuit(s) in accordance with some embodiments.

FIG. 11 is a diagram plotting a normalized gain of amplifier circuitry 100 as a function of input power Pin. Curve 400 may represent the gain of circuitry 100 when no compensation circuit 110 has been activated or switched into use. As shown in FIG. 11, curve 400 can exhibit gain compression at relatively low Pin levels, as illustrated by the relatively early roll off in gain. In contrast, curve 402 represents the gain of circuitry 100 when at least one compensation circuit such as circuit 110-1 has been activated or switched into use. Curve 402 pushes out the gain roll-off point but experiences some amount of gain peaking before the roll off in gain. Such gain peaking may be due to residual error left over uncanceled from the higher order non-linearities associated with the first auxiliary circuit 110-1. Furthermore, curve 404 represents the gain of circuitry 100 when both compensation circuits 110-1 and 110-2 have been activated or switched into use. Activation of the second auxiliary compensation circuit 110-2 can help cancel out any remaining residual error left over from the first auxiliary compensation circuit 110-1, which results in reduced gain peaking and distortion and thus a flatter gain response.

Figure 12:
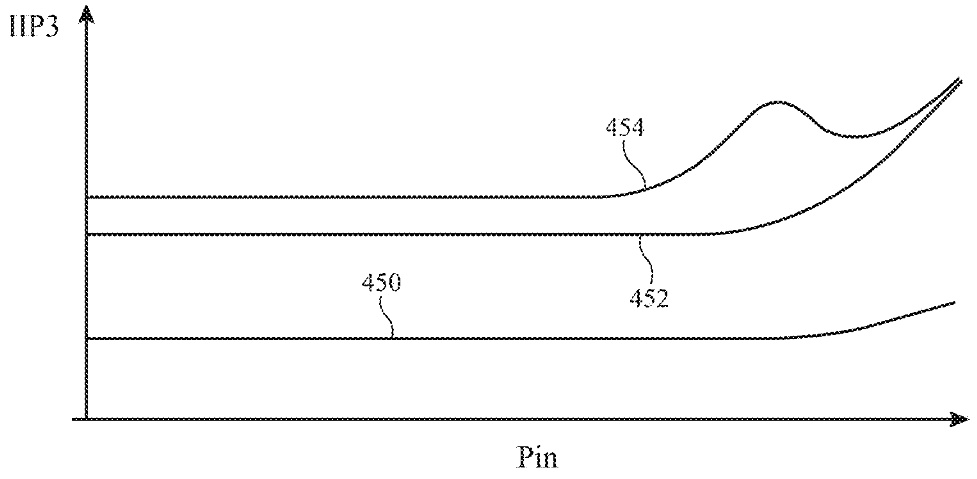
FIG. 12 is a plot showing how third order intercept point can be improved by selectively activating one or more AMAM distortion compensation circuit(s) in accordance with some embodiments.

FIG. 12 is a plot showing how a third order intercept point can be improved by selectively activating one or more AMAM distortion compensation circuit(s) 110. In particular, FIG. 12 plots the "input" third-order intercept point or IIP3, which is a parameter used to characterize the linearity of an electronic circuit such as amplifier circuitry 100. The input $3^{rd}$ order intercept point can represent the input power level Pin at which the third-order intermodulation products generated by circuitry 100 reach the same level as the desired output signal in a two-tone scenario. In general, it is desirable to increase the IIP3. As shown in FIG. 12, curve 450 represents the IIP3 profile for circuitry 100 when no compensation circuit 110 has been activated or switched into use.

In contrast, curve 452 represents the IIP3 profile for amplifier circuitry 100 when at least one compensation circuit such as compensation circuit 110-1 has been activated or switched into use. Curve 452 exhibits improved or greater IIP3 levels compared to curve 450. Moreover, curve 454 represents the IIP3 profile for circuitry 100 when multiple compensation circuits such as compensation circuits 110-1 and 110-2 have been activated or switched into use. Curve 454 exhibits improved or greater IIP3 levels compared to curve 452. Activation of the second auxiliary compensation circuit 110-2 can help cancel out any remaining residual error left over from the first auxiliary compensation circuit 110-1, which results in improved third order intercept point (IP3) levels. Although FIG. 12 shows input IP3, a similar improvement can be achieved when plotting "output" third-order intercept points (OIP3) for amplifier circuitry 100, by selectively activating one or more AMAM distortion compensation circuits 110.

Figure 13:
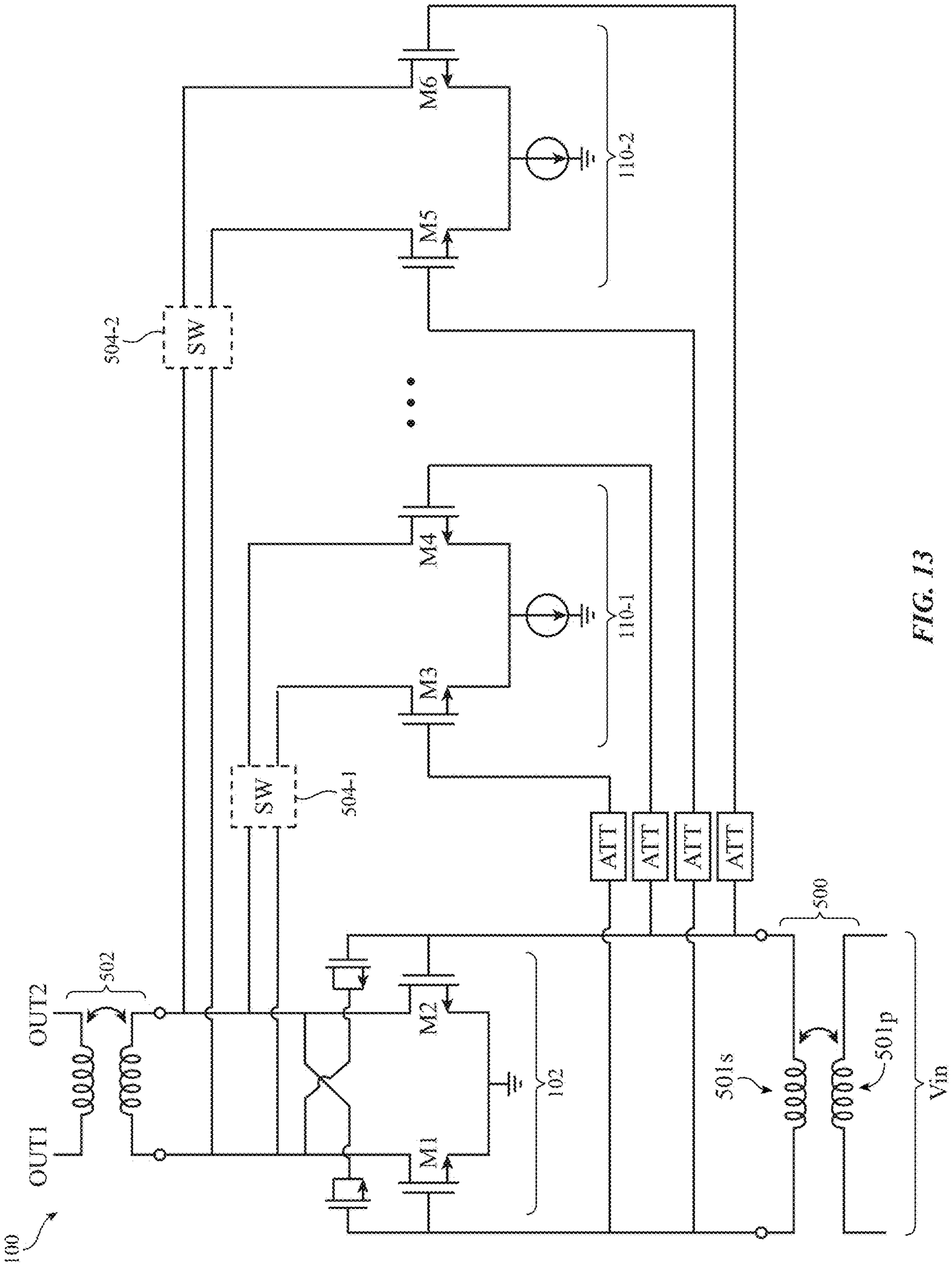
FIG. 13 is a circuit diagram of illustrative amplifier circuitry having AMAM distortion compensation circuits coupled to an input transformer in accordance with some embodiments.

The example of FIG. 3 in which the gate terminals of input transistors M1 and M2 are directly coupled to input terminals IN1 and IN2 is illustrative. FIG. 13 shows another embodiment of amplifier circuitry 100 having a differential input port coupled to a transformer 500. In particular, transformer 500 may have a primary coil 501*p* configured to receive input voltage signal Vin and a secondary coil 501*s* with opposing terminals coupled to the gate terminals of input transistors M1 and M2. Transformer 500 is thus sometimes referred to as an input transformer. If desired, the input transistors M1 and M2 may have drain terminals coupled to the amplifier output terminals OUT1 and OUT2 via an additional transformer 502. Transformer 502 coupled to output terminals OUT1 and OUT2 may be referred to as an output transformer. Other load components can be employed, if desired.

As shown in FIG. 13, the AMAM distortion compensation circuits 110 can be coupled to main amplifier 102 via optional switching circuits 504. For instance, the first compensation circuit 110-1 may be selectively coupled to the drain terminals of input transistors M1 and M2 via a first switching circuit 504-1, whereas the second compensation circuit 110-2 may be selectively coupled to the drain terminals of input transistors M1 and M2 via a second switching circuit 504-2. The switching circuits 504 may be configured to couple compensation circuits 110 to amplifier 102 via a desired switching polarity. For instance, switching circuit 504-1 may be configured to couple compensation circuit 110-1 to amplifier 102 via an in-phase (or "positive" polarity) connection, an out-of-phase (or "negative" polarity) connection, or can optionally decouple compensation circuit 110-1 from amplifier 102 to deactivate or disable circuit 110-1. Similarly, switching circuit 504-2 may be configured to couple compensation circuit 110-2 to amplifier 102 via an in-phase (or "positive" polarity) connection, an out-of-phase (or "negative" polarity) connection, or can optionally decouple compensation circuit 110-2 from amplifier 102 to deactivate or disable circuit 110-2. Each additional compensation circuit 110 that is included within amplifier circuitry 100 can be selectively coupled to amplifier 102 via a respective switching circuit 504.

Figure 14:
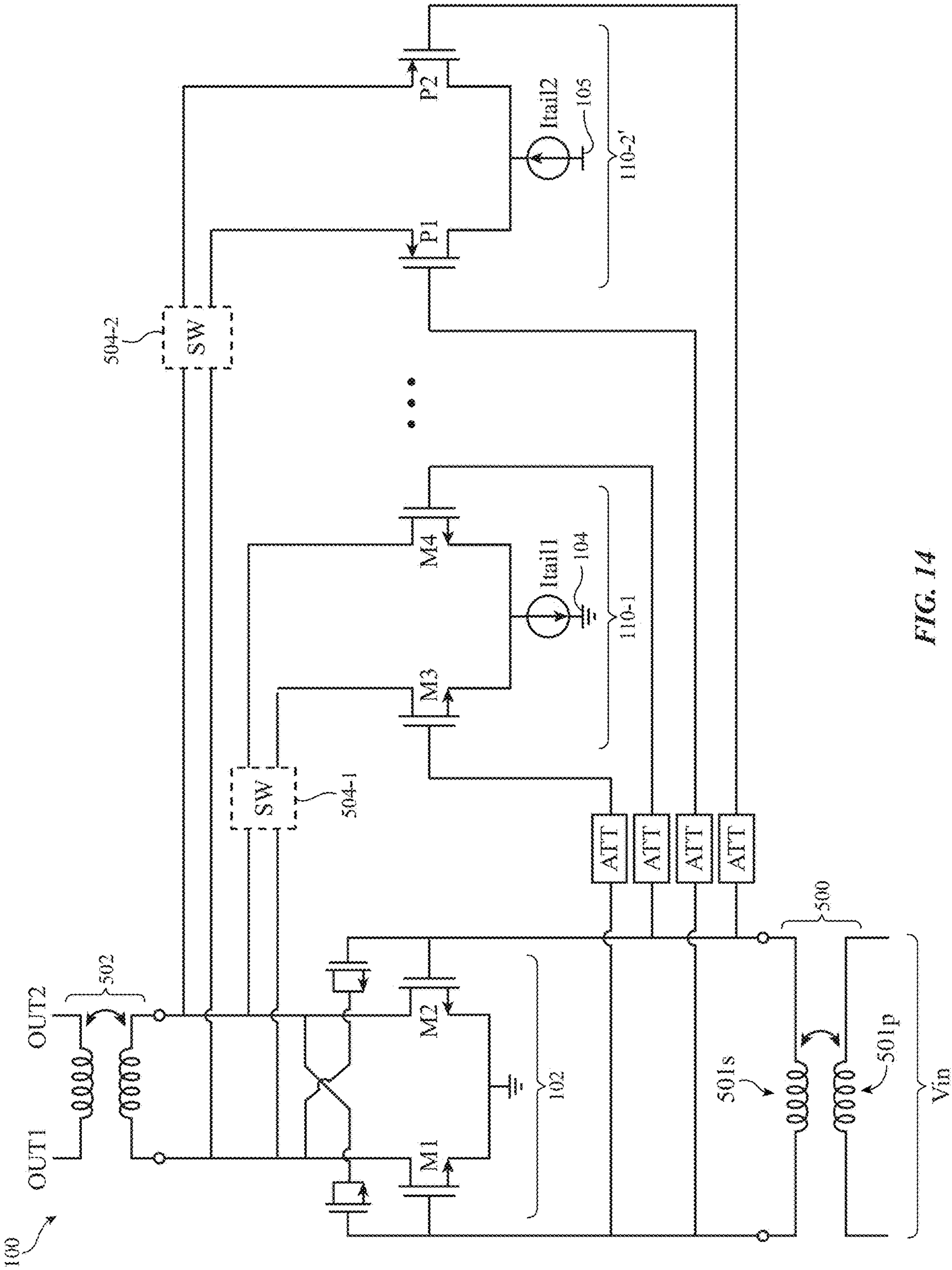
FIG. 14 is a circuit diagram of illustrative amplifier circuitry having different types of AMAM distortion compensation circuits in accordance with some embodiments.

The example of FIG. 13 in which the AMAM distortion compensation circuits 110 include only n-type transistors (see, e.g., NMOS transistors M3, M4, M5, and M6) is illustrative. FIG. 14 illustrates another embodiment of amplifier circuitry 100 in which the AMAM distortion compensation circuits 110 can be implemented using different types of transistors. As shown in FIG. 14, the first compensation circuit 110-1 can include n-type (n-channel) transistors M3 and M4 having source terminals coupled to first tail current source Itail1 and having drain terminals coupled to main amplifier 102 via a first optional switching circuit 504-1.

On the other hand, the second compensation circuit 110-2 can include p-type (p-channel transistors) P1 and P2. Transistors P1 and P2 can be p-type metal-oxide-semiconductor (PMOS) transistors or other types of p-type switches. Transistors P1 and P2 can have first source-drain terminals coupled to tail current source Itail2 and second source-drain terminals coupled to main amplifier 102 via a second optional switching circuit 504-2. Tail current source Itail2 may have a first terminal coupled to the first source-drain terminals of transistors P1 and P2 and may have a second terminal coupled to a power supply line 105 (e.g., a positive power supply line on which a positive power supply voltage is provided). In general, amplifier circuitry 100 can include one or more AMAM distortion compensation circuit(s) 110, portions of which can include n-type and p-type transistors as shown in the example of FIG. 14, all of which can include only n-type transistors as shown in the example of FIGS. 3 and 13, or all of which can include only p-type transistors.

Although the embodiments described in connection with FIGS. 1-14 are primarily directed towards compensating AMAM distortion, the techniques described herein can additionally or alternatively be employed to compensate AMPM distortion. For example, the main amplifier can optionally be coupled to one or more auxiliary compensation circuits, at least some of which can be configured with the appropriate transistor type(s), transistor sizing, and/or bias voltage for reducing AMPM distortion or to otherwise improve the linearity performance of the overall circuitry. Auxiliary circuits 110-1 and 110-2 can thus sometimes also be referred to as AMAM and/or AMPM distortion compensation circuits.

The methods and operations described above in connection with FIGS. 1-14 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. Circuitry comprising:
first and second input transistors; and
a distortion compensation circuit that includes:
a third transistor having a gate terminal coupled to a gate terminal of the first input transistor;
a fourth transistor having a gate terminal coupled to a gate terminal of the second input transistor; and
a tail current source coupled to a first source-drain terminal of the third transistor and to a first source-drain terminal of the fourth transistor; and
a signal attenuation circuit coupled in series between the gate terminal of the first input transistor and the gate terminal of the third transistor.

2. The circuitry of claim 1, wherein:
the gate terminal of the first input transistor is coupled to a first input terminal of the circuitry; and
the first input transistor further comprises a first source-drain terminal coupled to a power supply line and a second source-drain terminal coupled to a first output terminal of the circuitry.

3. The circuitry of claim 2, wherein:
the gate terminal of the second input transistor is coupled to a second input terminal of the circuitry; and
the second input transistor further comprises a first source-drain terminal coupled to the power supply line and a second source-drain terminal coupled to a second output terminal of the circuitry.

4. The circuitry of claim 1, wherein:
the third transistor further comprises a second source-drain terminal coupled to the second input transistor; and
the fourth transistor further comprises a second source-drain terminal coupled to the first input transistor.

5. The circuitry of claim 4, further comprising:
a switching circuit coupled between the first input transistor and the third transistor and further coupled between the second input transistor and the fourth transistor.

6. The circuitry of claim 1, wherein the signal attenuation circuit is configured to provide an adjustable attenuation factor for tuning a gain compression voltage range of the distortion compensation circuit.

7. The circuitry of claim 1, wherein the tail current source is configured to pass a tail current that is less than a fifth of an output current flowing through the first and second input transistors.

8. The circuitry of claim 1, further comprising an additional distortion compensation circuit having:
a fifth transistor having a gate terminal coupled to the gate terminal of the first input transistor;
a sixth transistor having a gate terminal coupled to the gate terminal of the second input transistor; and
an additional tail current source coupled to a first source-drain terminal of the fifth transistor and to a first source-drain terminal of the sixth transistor.

9. The circuitry of claim 8, wherein:
the third transistor further comprises a second source-drain terminal coupled to the second input transistor;
the fourth transistor further comprises a second source-drain terminal coupled to the first input transistor;
the fifth transistor further comprises a second source-drain terminal coupled to the first input transistor; and
the sixth transistor further comprises a second source-drain terminal coupled to the second input transistor.

10. The circuitry of claim 9, further comprising:
a first switching circuit coupled between the distortion compensation circuit and the first and second input transistors; and
a second switching circuit coupled between the additional distortion compensation circuit and the first and second input transistors.

11. The circuitry of claim 8, further comprising:
a first additional attenuation circuit coupled between the gate terminal of the second input transistor and the gate terminal of the fourth transistor; and
second additional attenuation circuits coupled between the gate terminals of the first and second input transistors and the gate terminals of the fifth and sixth transistors.

12. The circuitry of claim 8, wherein the third, fourth, fifth, and sixth transistors comprise n-type transistors.

13. The circuitry of claim 8, wherein the third and fourth transistors comprise n-type transistors, and wherein the fifth and sixth transistors comprise p-type transistors.

14. The circuitry of claim 1, further comprising:
a first transformer coupled to the gate terminals of the first and second input transistors; and
a second transformer coupled to source-drain terminals of the first and second input transistors.

15. The circuitry of claim 1, wherein the signal attenuation circuit comprises a capacitive divider or a resistive divider.

16. The circuitry of claim 1, wherein the signal attenuation circuit comprises a transformer.

17. Circuitry comprising:
a differential amplifier having first and second input terminals;
a first distortion compensation circuit having input terminals coupled to the first and second input terminals of the differential amplifier, wherein the first distortion compensation circuit is further coupled out-of-phase with the differential amplifier; and
a second distortion compensation circuit having input terminals coupled to the first and second input terminals of the differential amplifier, wherein the second distortion compensation circuit is coupled in-phase with the differential amplifier.

18. The circuitry of claim 17, wherein the first distortion compensation circuit further comprises a tail current source configured to pass a tail current that is less than a half of an output current flowing through the differential amplifier.

19. The circuitry of claim 17, further comprising:
first tunable attenuation circuits coupled between the first and second input terminals of the differential amplifier and the first distortion compensation circuit; and
second tunable attenuation circuits coupled between the first and second input terminals of the differential amplifier and the second distortion compensation circuit.

20. Circuitry comprising:
a first input transistor having a gate terminal coupled to a first input terminal, a drain terminal coupled to a first output terminal, and a source terminal coupled to a ground line;
a second input transistor having a gate terminal coupled to a second input terminal, a drain terminal coupled to a second output terminal, and a source terminal coupled to the ground line;
a third transistor having a gate terminal coupled to the gate terminal of the first input transistor, a source terminal coupled to a first tail current source, and a drain terminal coupled to the second output terminal;
a fourth transistor having a gate terminal coupled to the gate terminal of the second input transistor, a source terminal coupled to the first tail current source, and a drain terminal coupled to the first output terminal;
a fifth transistor having a gate terminal coupled to the gate terminal of the first input transistor, a source terminal coupled to a second tail current source, and a drain terminal coupled to the first output terminal; and
a sixth transistor having a gate terminal coupled to the gate terminal of the second input transistor, a source terminal coupled to the second tail current source, and a drain terminal coupled to the second output terminal.

* * * * *